US008614499B2

(12) United States Patent
Smythe

(10) Patent No.: US 8,614,499 B2
(45) Date of Patent: *Dec. 24, 2013

(54) MEMORY CELL HAVING HEATER MATERIAL AND VARIABLE RESISTANCE MATERIAL EMBEDDED WITHIN INSULATING MATERIAL

(75) Inventor: John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/486,678

(22) Filed: Jun. 1, 2012

(65) Prior Publication Data

US 2012/0235108 A1    Sep. 20, 2012

Related U.S. Application Data

(60) Continuation of application No. 12/844,541, filed on Jul. 27, 2010, now Pat. No. 8,193,607, which is a division of application No. 12/365,473, filed on Feb. 4, 2009, now Pat. No. 7,785,978.

(51) Int. Cl.
*H01L 45/00* (2006.01)

(52) U.S. Cl.
USPC .................................. 257/536; 257/E45.002

(58) Field of Classification Search
USPC ........................................................ 438/515
See application file for complete search history.

(56) References Cited

U.S. PATENT DOCUMENTS

| | | |
|---|---|---|
| 5,335,219 A | 8/1994 | Ovshinsky et al. |
| 5,970,336 A | 10/1999 | Wolstenholme et al. |
| 7,071,122 B2 | 7/2006 | Saenger et al. |
| 7,221,579 B2 | 5/2007 | Krusin-Elbaum et al. |
| 7,405,152 B2 | 7/2008 | Gambino et al. |
| 8,193,607 B2 * | 6/2012 | Smythe .................. 257/536 |
| 2004/0037179 A1 | 2/2004 | Lee |
| 2006/0093753 A1 | 5/2006 | Nickel |
| 2006/0120205 A1 | 6/2006 | Odagawa et al. |
| 2006/0172086 A1 | 8/2006 | Nickel |
| 2006/0175597 A1 | 8/2006 | Happ |
| 2007/0070681 A1 | 3/2007 | Rohr |
| 2007/0075304 A1 | 4/2007 | Chang et al. |
| 2007/0082469 A1 | 4/2007 | Peters |
| 2007/0148855 A1 | 6/2007 | Chen et al. |
| 2007/0148862 A1 | 6/2007 | Chen et al. |

(Continued)

FOREIGN PATENT DOCUMENTS

| | | |
|---|---|---|
| CN | 1898798 A | 1/2007 |
| JP | 04-354865 | 12/1992 |

(Continued)

OTHER PUBLICATIONS

Notice of Rejection Ground dated Jun. 25, 2013.

*Primary Examiner* — Stephen W Smoot

(74) *Attorney, Agent, or Firm* — Dickstein Shapiro LLP

(57) ABSTRACT

A variable resistance memory cell structure and a method of forming it. The method includes forming a first electrode, forming an insulating material over the first electrode, forming a via in the insulating material to expose a surface of the first electrode, forming a heater material within the via using gas cluster ion beams, forming a variable resistance material within the via, and forming a second electrode such that the heater material and variable resistance material are provided between the first and second electrodes.

16 Claims, 16 Drawing Sheets

(56) References Cited

U.S. PATENT DOCUMENTS

| | | |
|---|---|---|
| 2007/0257246 A1 | 11/2007 | Bakkers et al. |
| 2007/0295949 A1 | 12/2007 | Lee |
| 2008/0121859 A1 | 5/2008 | Campbell |
| 2008/0258125 A1 | 10/2008 | Liu et al. |
| 2008/0268565 A1 | 10/2008 | Lung |
| 2008/0277641 A1 | 11/2008 | Stanton |
| 2009/0001341 A1 | 1/2009 | Breitwisch et al. |
| 2009/0035514 A1 | 2/2009 | Kang et al. |
| 2009/0314963 A1 | 12/2009 | Hautala |

FOREIGN PATENT DOCUMENTS

| | | |
|---|---|---|
| JP | 05-267473 | 10/1993 |
| JP | 2006-156886 | 6/2006 |
| JP | 2007-235128 | 9/2007 |
| JP | 2007-294964 | 11/2007 |
| JP | 2008-060091 | 3/2008 |
| JP | 2008-071797 | 3/2008 |
| JP | 2008-085204 | 4/2008 |
| JP | 2008-235904 | 10/2008 |
| JP | 2008-288587 | 11/2008 |

* cited by examiner

MEMORY CELL HAVING HEATER MATERIAL AND VARIABLE RESISTANCE MATERIAL EMBEDDED WITHIN INSULATING MATERIAL

CROSS-REFERENCE TO RELATED APPLICATIONS

This application is a continuation of U.S. patent application Ser. No. 12/844,541, filed Jul. 27, 2010, (now U.S. Pat. No. 8,193,607), which is a divisional of U.S. patent application Ser. No. 12/365,473, filed Feb. 4, 2009 (now U.S. Pat. No. 7,785,978), each of which is hereby incorporated by reference in its entirety.

FIELD OF THE INVENTION

Embodiments of the invention relate to the field of semiconductor devices. In particular, the embodiments relate to a method of using gas cluster ion beams (GCIB) to fabricate memory cells.

BACKGROUND OF THE INVENTION

Non-volatile phase-change memory cells are desirable elements of integrated circuits due to their ability to maintain data absent a supply of power. Various variable resistance materials have been investigated for use in non-volatile memory cells, including chalcogenide alloys, which are capable of stably transitioning between amorphous and crystalline phases. Each phase exhibits a particular resistance state and the resistance states can be used to distinguish the logic values of the memory cell. Specifically, an amorphous state exhibits a relatively high resistance, while a crystalline state exhibits a relatively low resistance.

One such phase-change memory cell 110 may have the structure illustrated in FIGS. 1A and 1B, which includes a layer of phase-change material 116 between first and second electrodes 112, 118, which are supported by a dielectric material 114 that has an opening containing the first electrode 112. The phase-change material 116 is set to a particular resistance state according to the amount of current applied by the first and second electrodes 112, 118. To obtain an amorphous state (FIG. 1B), an initial write current pulse (i.e., a reset pulse) is applied for a first period of time through the conventional phase-change memory cell 110 to alter at least a portion 126 of the phase-change material 116 adjacent to the first electrode 112. The current is removed and the phase-change material 116 cools to a temperature below the crystallization temperature, which results in the portion 126 of the phase-change material 116 covering the first electrode 112 having the amorphous state. To obtain a crystalline state (FIG. 1A), a write current pulse (i.e., a set pulse) lower than the initial write current pulse is applied to the phase-change memory cell 110 for a second period of time, which is typically longer in duration than the crystallization time of amorphous phase-change material, resulting in the heating of the amorphous portion 126 of the phase-change material 116 to a temperature below its melting point, but above its crystallization temperature. This causes the amorphous portion 126 of the phase-change material 116 to re-crystallize. The amorphous portion 126 recrystallizes to a state that is maintained once the current is removed and the phase-change memory cell 110 is cooled. The phase-change memory cell 110 is read by applying a read voltage to the electrodes 112, 118, which does not change the state of the phase-change material 116, but which permits reading of the resistance of the phase-change material 116.

One potential drawback of the above described phase-change memory device 110 is the large programming current needed to achieve the phase change. This need for the large current is a limitation when attempting to reduce the size of the memory cell and when large memory cell arrays are fabricated. Another problem associated with the above described phase-change memory cell 110 is heat loss. Since the phase-change material 116 is in direct contact with a large area of the first electrode 112, there may be a significant amount of heat loss resulting in a large reset current requirement. Additionally, since the programmable volume (i.e., portion 126) of the phase-change material 116 is not confined and has the freedom to extend sideways during phase change, switching stability may be reduced.

One technique to reduce the high current requirement, reduce heat loss, and improve switching stability confines and reduces the programmable volume of the phase-change material 116 and also reduces the electrode area in contact with the programmable volume. FIG. 2A illustrates one example of a phase-change memory cell 210 using the confined technique. To fabricate the phase-change memory cell 210, a via, e.g. a cylindrical via, is etched into a second insulating layer 224 to expose the first electrode 212. A layer of phase-change material 216 is deposited along the sidewall 230 of the via 222 to serve as the programmable volume of the phase-change memory cell 210. A third insulating layer 228 is deposited over the phase-change material 216 and within the via 222. A subsequent chemical-mechanical planarization (CMP) step removes the phase-change material 216 and the insulating material 228, stopping at the second insulating layer 224. The CMP process exposes a ring 232 of phase-change material 216, which can be covered by and in contact with the second electrode 218.

Referring to FIG. 2B, it is known that due to arrival angle distribution and poor step coverage, a conventional physical vapor deposition (PVD) process cannot always accurately control the thickness of the phase-change material 216 deposited along the sidewall 230 of a via 222. The thick layer of phase-change material deposited on a field region 231 surrounding the via 222 poses a problem for the subsequent CMP process, as it introduces large film stress and phase-change material adhesion issues during the CMP process. An excessive overhang of material at the top of the via 222 may cause a "necking in" of the opening which may restrict or prohibit subsequent thin film depositions and/or filling of the structure. This problem may result in voids in the phase-change memory cell and failed memory devices.

It is therefore desirable to use a fabrication process that provides the level of anisotropy needed at the interface between heater and phase-change material without introducing problems in the overall process flow. It is also desirable to reduce voids and provide a method of fabricating a semiconductor device that allows for the recovery of failed devices due to an excessive overhang of material at the opening of phase-change memory vias.

DETAILED DESCRIPTION OF THE INVENTION

In the following detailed description, reference is made to certain embodiments. These embodiments are described with sufficient detail to enable those skilled in the art to practice them. It is to be understood that other embodiments may be employed, and that various structural, logical, and electrical changes may be made.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Embodiments described herein provide a method of forming a material on the bottom of a via that provides the level of anisotropy needed at the interface between heater and variable resistance material. That is, the method provides for uniform coverage at the bottom of a high aspect ratio via without significant deposition on the sidewalls of the via. The method uses gas cluster ion beams (GCIB) to deposit material that exists only in the bottom of the via of a variable resistance memory cell. The method includes forming a first electrode, forming an insulating material over the first electrode, forming a via in the insulating material to expose a surface of the first electrode, forming a heater material on the surface of the first electrode using gas cluster ion beams, removing a portion of the heater material over the insulating material, forming a variable resistance material over the heater material, and forming a second electrode over the variable resistance material.

Referring to FIGS. 3A-3I, one embodiment is now described with reference to the formation of a variable resistance memory cell, wherein like reference numbers are used consistently for like features throughout the drawings. The embodiments described herein can be utilized for an array of memory cells, which can be formed simultaneously, or in parts of an integrated circuit not used as memory cells.

Figure 1A:
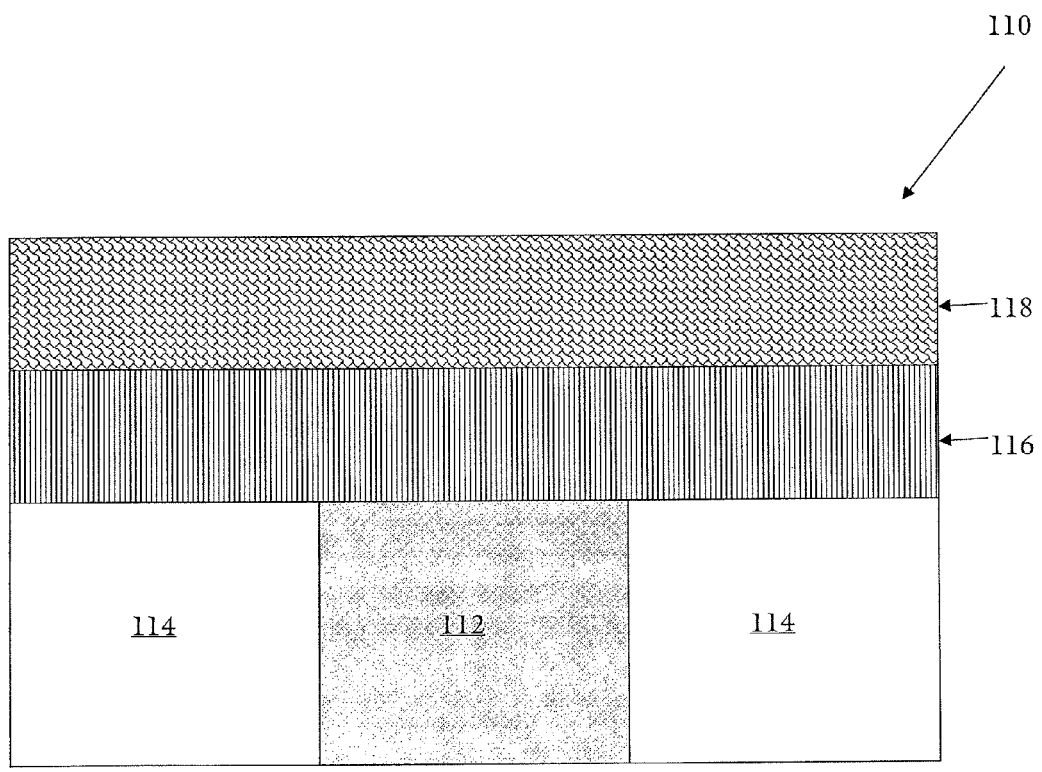
FIGS. 1A-1B are schematic views of a conventional phase-change memory cell.
Figure 1B:
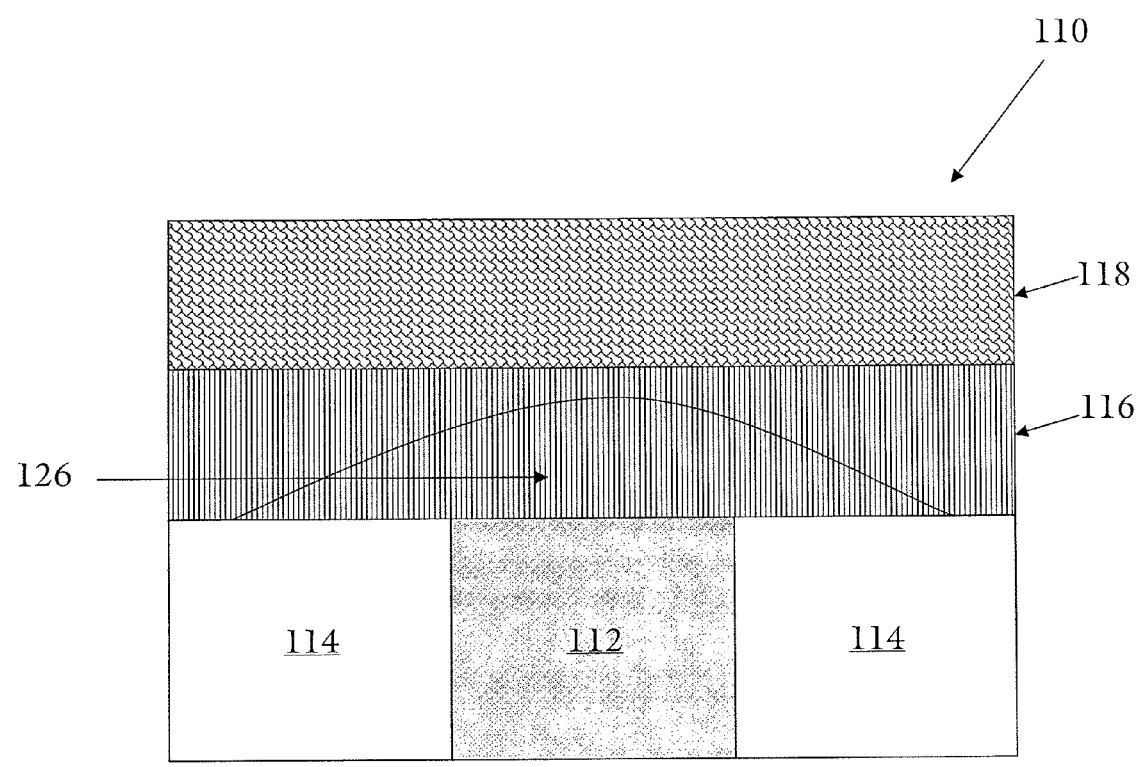
Figure 2A:
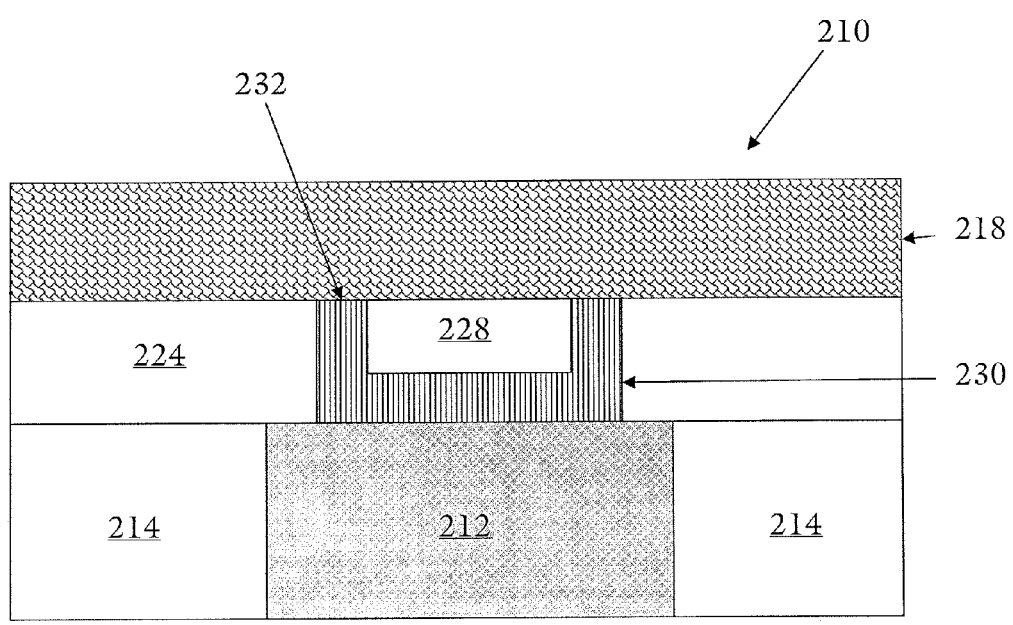
FIGS. 2A-2B are schematic views of another conventional phase-change memory cell and its intermediate stages of fabrication.
Figure 2B:
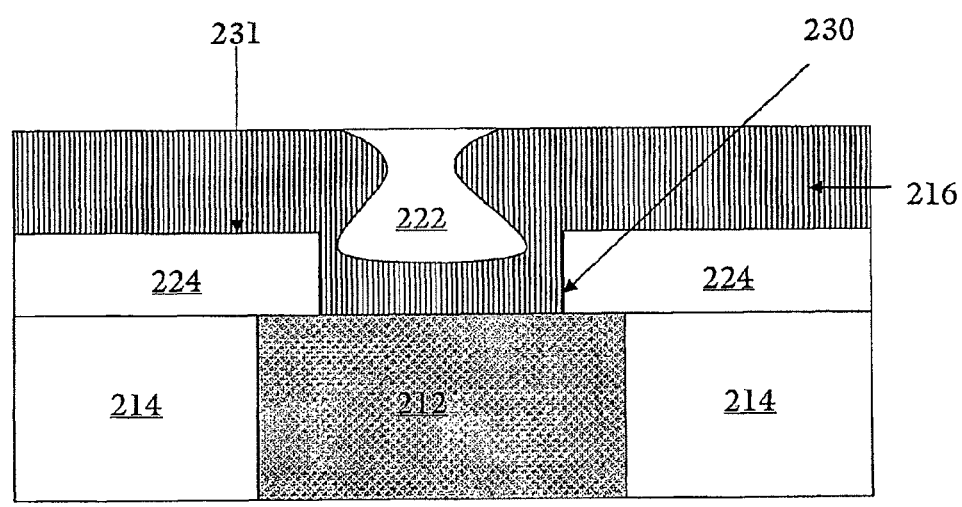
Figure 3A:
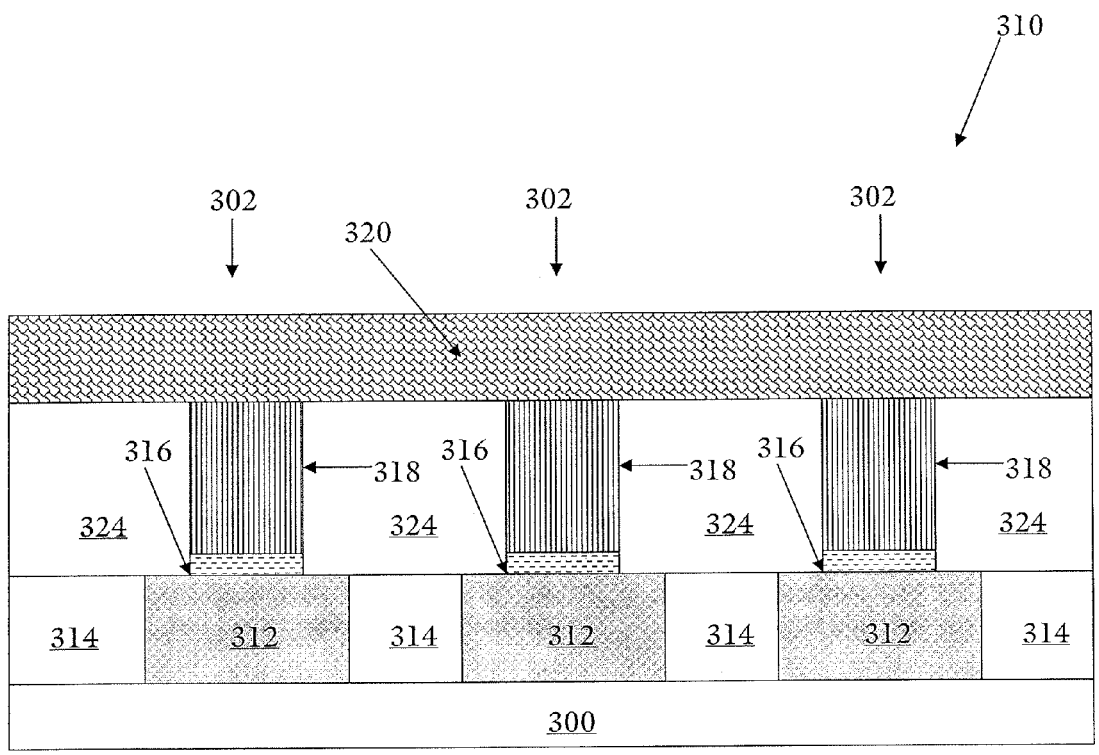
FIGS. 3A-3I schematically illustrate the formation of a variable resistance memory cell in accordance with an embodiment described therein.

FIG. 3A illustrates a memory device 310 which includes a plurality of variable resistance material memory cells 302 formed by the method described below with respect to FIGS. 3B-3I. Memory device 310 includes a substrate 300, first electrodes 312, heater material 316, variable resistance material 318, and second electrode 320. The memory cells 302 are formed within insulating layers 314, 324.

Figure 3B:
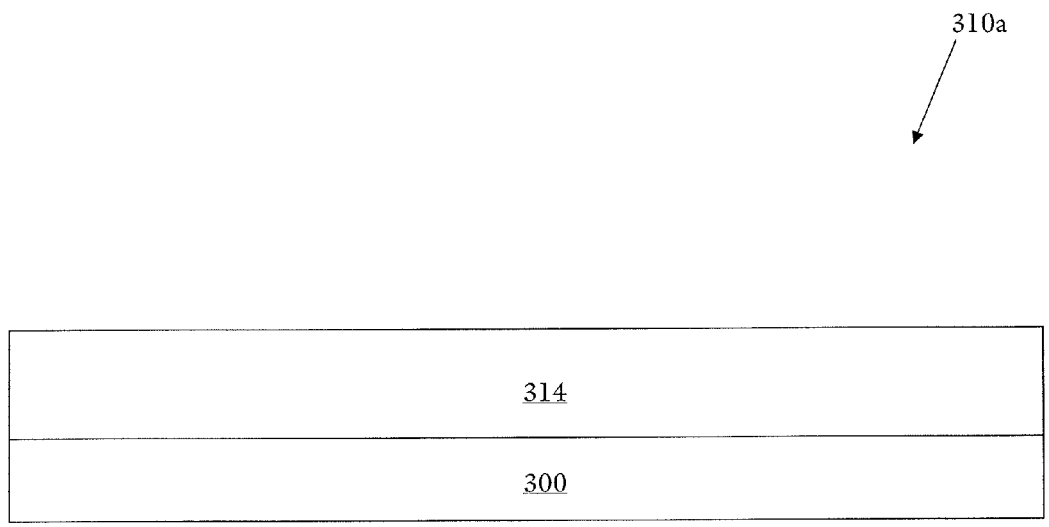

FIG. 3B depicts an intermediate variable resistance memory device structure 310a formed by, for example, depositing a first insulating layer 314 over a support substrate 300. The first insulating layer 314 can be formed by any suitable method and can be any insulating material such as e.g., nitrides, oxides, high temperature polymers, low dielectric constant materials, insulating glass, and insulating polymers, among others.

Figure 3C:
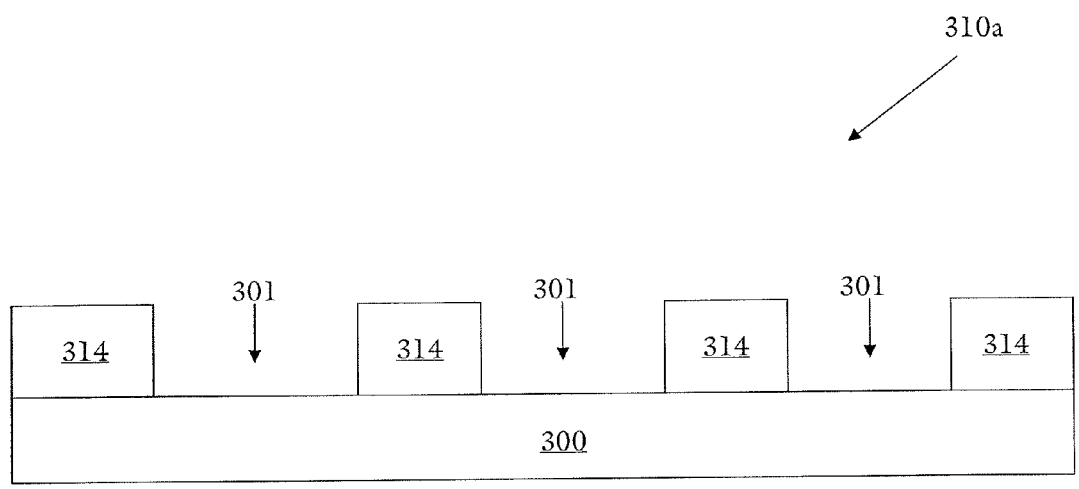
Figure 3D:
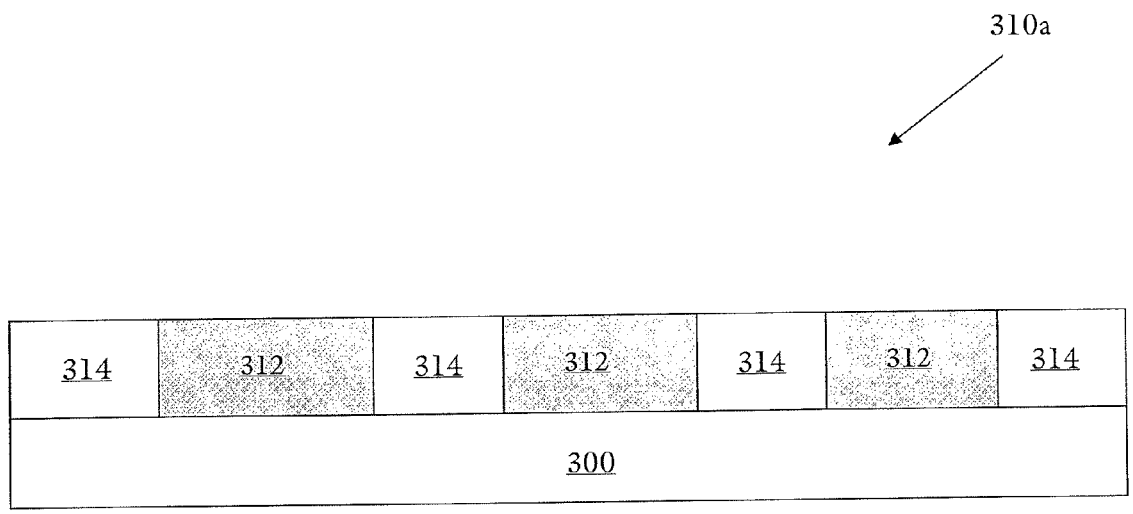

As shown in FIG. 3C, the first insulating layer 314 is etched by any suitable method to create vias 301. A first electrode 312 is formed within the vias 301, as depicted in FIG. 3D. The first electrode 312 can be formed by any suitable method and can be any conductive material such as e.g., titanium nitride (TiN), tantalum nitride (TaN), tungsten (W), tungsten nitride (WN), titanium aluminum nitride (TiAlN), titanium tungsten (TiW) or platinum (Pt), among others.

Figure 3E:
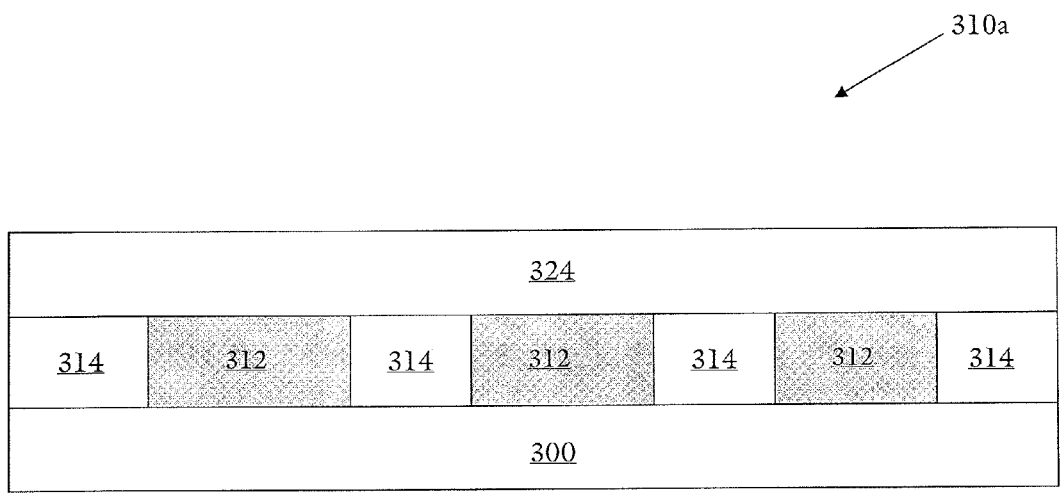

Subsequently, as shown in FIG. 3E, a second insulating layer 324 is formed over the first insulating layer 314 and the first electrode 312. The second insulating layer 324 can be formed by any suitable method and can be any insulating material such as e.g., nitrides, oxides, high temperature polymers, low dielectric constant materials, insulating glass, or insulating polymers, and may be formed by any method known in the art.

Figure 3F:
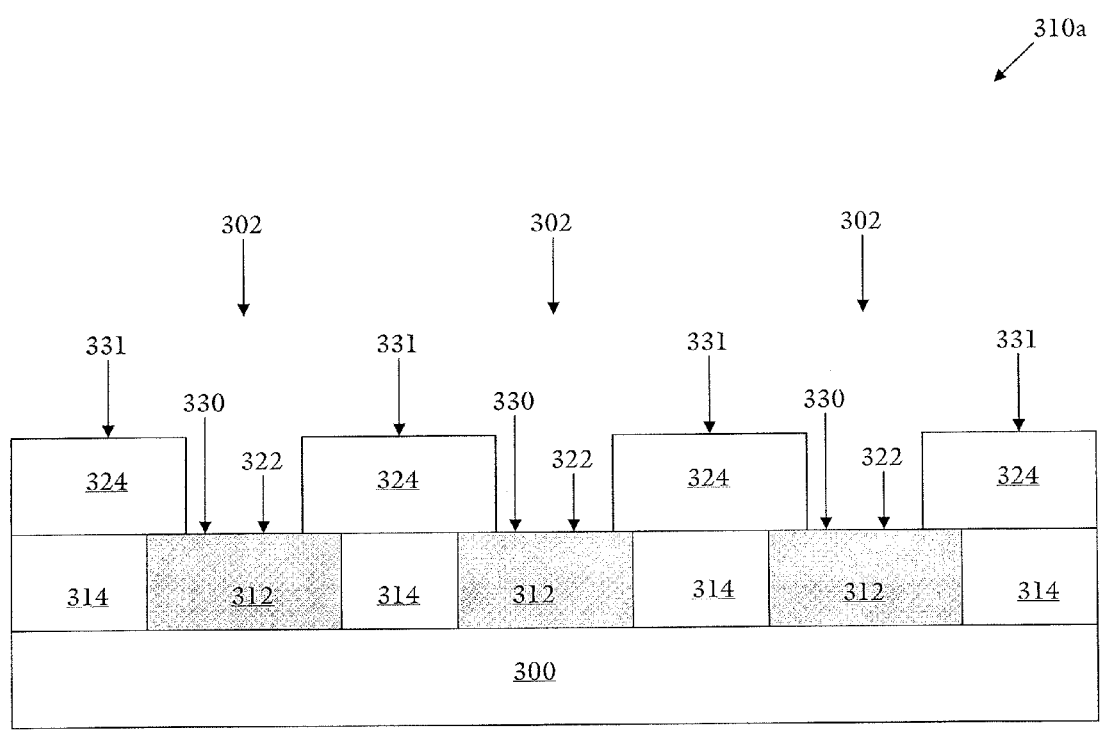

Referring now to FIG. 3F, vias 322 are formed in the second insulating layer 324 using methods known in the art, such as photolithographic and etching techniques, to expose a portion of a respective first electrode 312. Optionally, the vias 322 can extend partially through respective first electrodes 312. The vias 322 have a bottom surface 330 and the second insulating layer 324 has a top surface 331. Preferably, the bottom surface 330 is a substantially planar surface. The via 322 can be of any suitable shape, including a substantially cylindrical shape. Although the embodiment is described in terms of forming a via, it can be appreciated that any type of opening including, but not limited to, other apertures, trenches, and contact holes may be formed, as appropriate for the application.

Figure 3G:
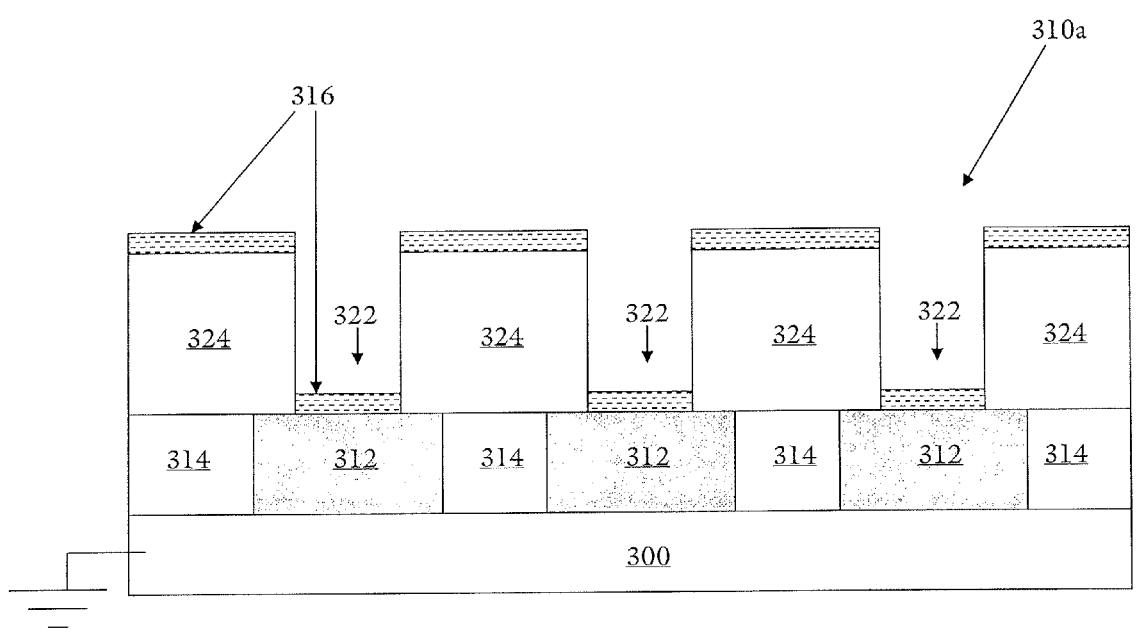

Referring now to FIG. 3G, once via 322 is formed, a GCIB deposited heater material 316 is formed over the bottom surfaces 330 of the vias 322 and the top surface 331 of the second insulating layer 324. The heater material 316 is formed such that there is no sidewall deposition except for that portion in contact with a sidewall due to the thickness of the heater material 316. In addition to or instead, the heater material 316 can act as a barrier and/or adhesion material.

Heater material 316 can be formed of a GeN material, which may have other atoms included, as follows. Gas is injected at high pressure into an ionization chamber of the GCIB tool, which can be the nFusion product made by TEL Epion, for example. Pressures are in a range from about 1500 to about 3000 PSI at the point of gas injection into the ionization chamber, which may be under vacuum. To deposit heater material 316, the GCIB process can use $GeH_4$, $N_2$, He and Ar gases. The percentage of each is used to control material thickness, nitrogen incorporation and anisotropy of the GeN material. Ionized molecular clusters are then directed towards the surface 330, 331 of the memory device 310a, which includes the exposed first electrodes 312 and the second insulating layer 324. The cluster is accelerated from a potential to ground of about 3 to about 50 keV. The clusters dissociate immediately upon impact with the surface of memory device 310a. The temperature and pressure of the surface increase rapidly for a time (e.g., a spike) on the order of from about 5 to about 15 psec as the beam is scanned across the surface of the memory device. The energy release of the gases creates the new GeN material on the surface or partially within the near surface of the memory device. The location of the new GeN material depends on the voltage potential, species and surface. Gas clusters can be on the order of 30 angstroms in diameter and may be formed of thousands of gas molecules.

During the fabrication process, when a GCIB is scanned across the surface of the memory device, the scan can include a combination of passes which may be a mix of $GeH_4$, Ge, $N_2$, Ar, He, methoxide, ethoxide, $O_2$, $F_2$, or $N_2O$ gases. The GCIB deposition process may include transitions in the amount of germane ($GeH_4$), nitrogen ($N_2$), argon (Ar), helium (He), methoxide, ethoxide, oxygen ($O_2$), fluorine ($F_2$), nitrous ($N_2O$) gases, or any combination thereof. Scans of pure $N_2$ may also be used to control the most beneficial concentration profile of nitrogen. The nitrogen level may be a top down or bottom up gradient within the thickness of the material. The gradient can be high to low, low to high, low to high to low, or high to low to high, depending on the adjacent materials.

Figure 3H:
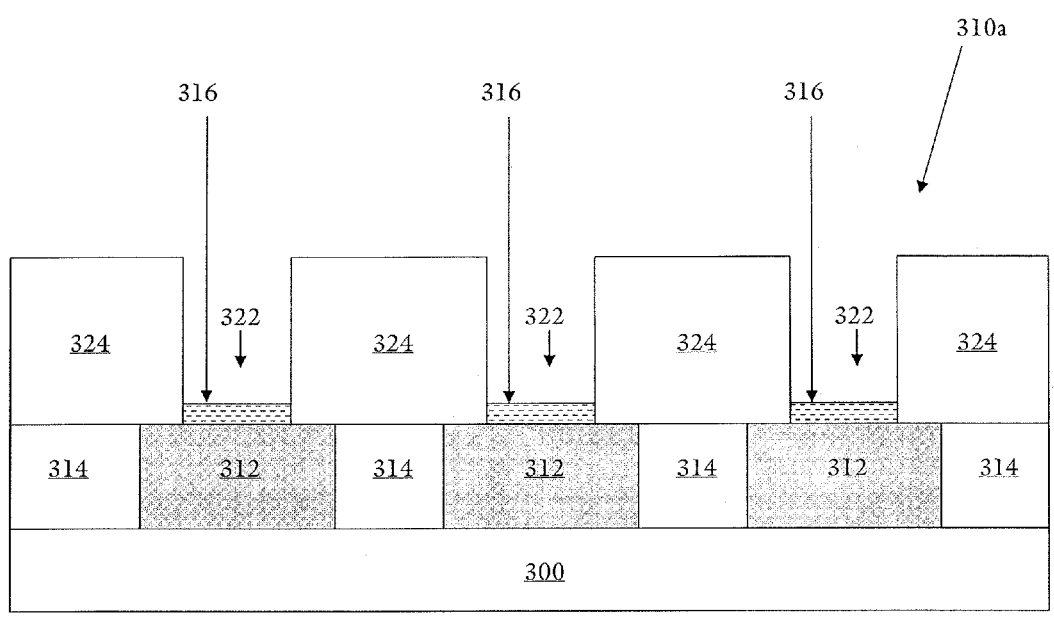

As shown in FIG. 3H, the portion of the GCIB deposited heater material 316 formed on the top surface 331 of the second insulating layer 324 is removed by any suitable technique, e.g. etch according to known techniques. The heater material 316 can include germanium (Ge) as the primary atom and other impurity atoms that can be from about 0.5 to about 15 atomic percent. The impurity atoms can include nitrogen (N), antimony (Sb), fluorine (F), oxygen (O), and tellurium (Te). In one embodiment, the impurity atoms are from 5-10 atomic percent.

Figure 3I:
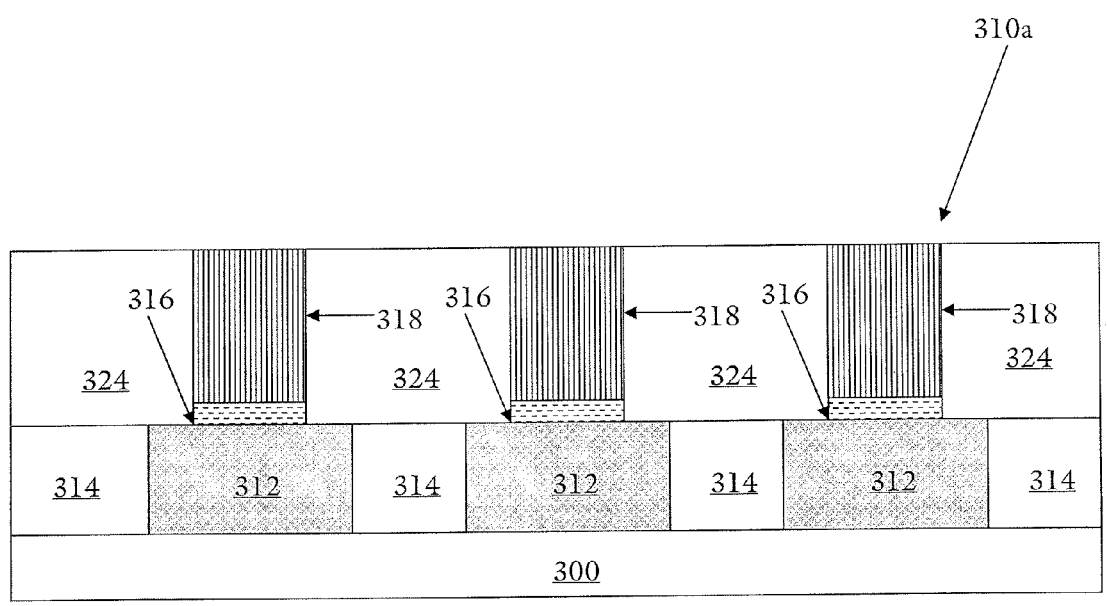

As depicted in FIG. 3I, a layer of variable resistance material 318 may be formed over the GCIB deposited heater material 316 by any suitable technique. Suitable techniques include physical vapor deposition, atomic layer deposition, chemical vapor deposition and wet immersion, among others. The variable resistance material 318 can be formed of any phase-change chalcogenide alloy, such as $Ge_xTe_y$, GaSb, $Sb_xTe_y$, InSb, InSe, $In_xSb_yTe_z$, $Sn_xSb_yTe_z$, $Ga_xSe_yTe_z$, InSbGe, AgInSbTe, GeSnSbTe, $Te_xGe_ySb_zS_k$ and GeSbSeTe, for example. Those variable resistance materials can also have impurities of oxygen (O), fluorine (F), nitrogen (N) and carbon (C). The variable resistance material 318 can also be formed of any other resistive cell material that does not require phase change to change resistance, including NiO, TiO, CuS and SrTiO.

A top electrode 320 may then be formed over the surface to obtain the resulting variable resistance memory device as shown in FIG. 3A.

Figure 4A:
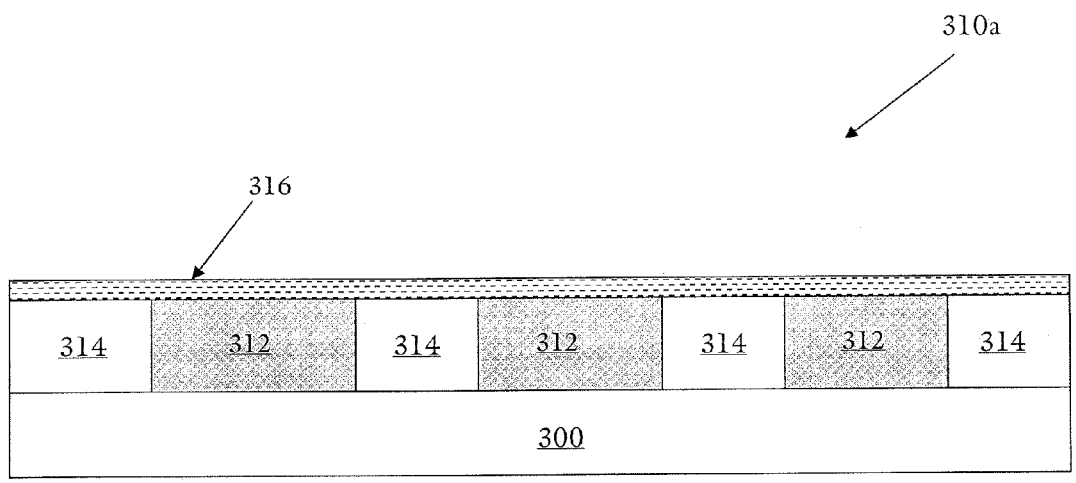
FIGS. 4A-4C schematically illustrate the formation of a variable resistance memory cell in accordance with some of the steps of another embodiment described therein.
Figure 4B:
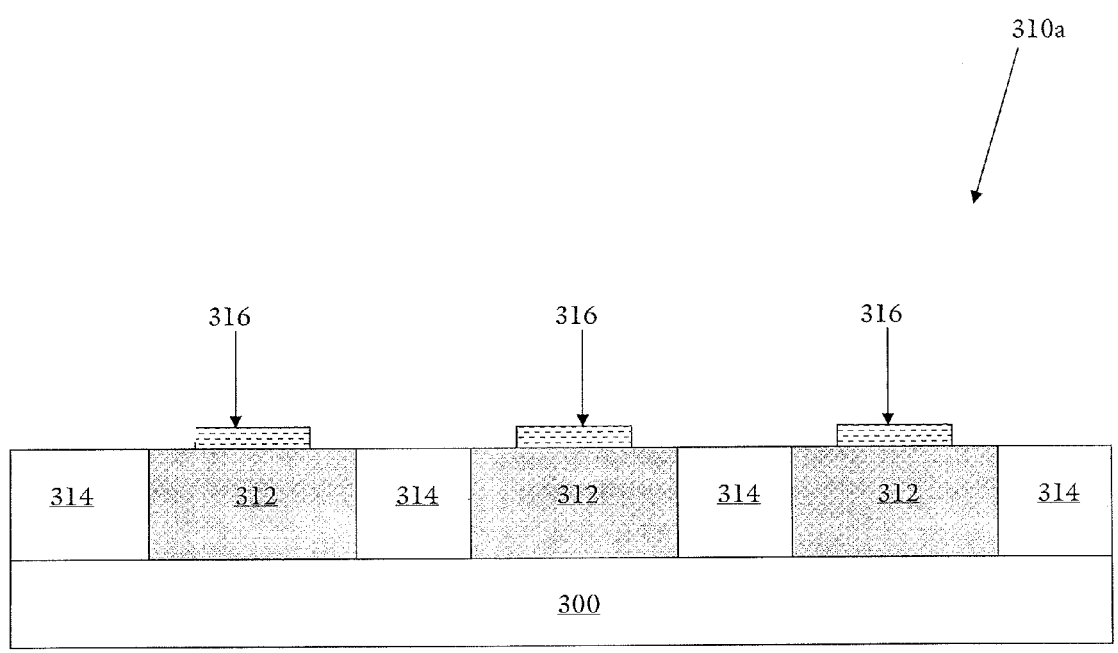
Figure 4C:
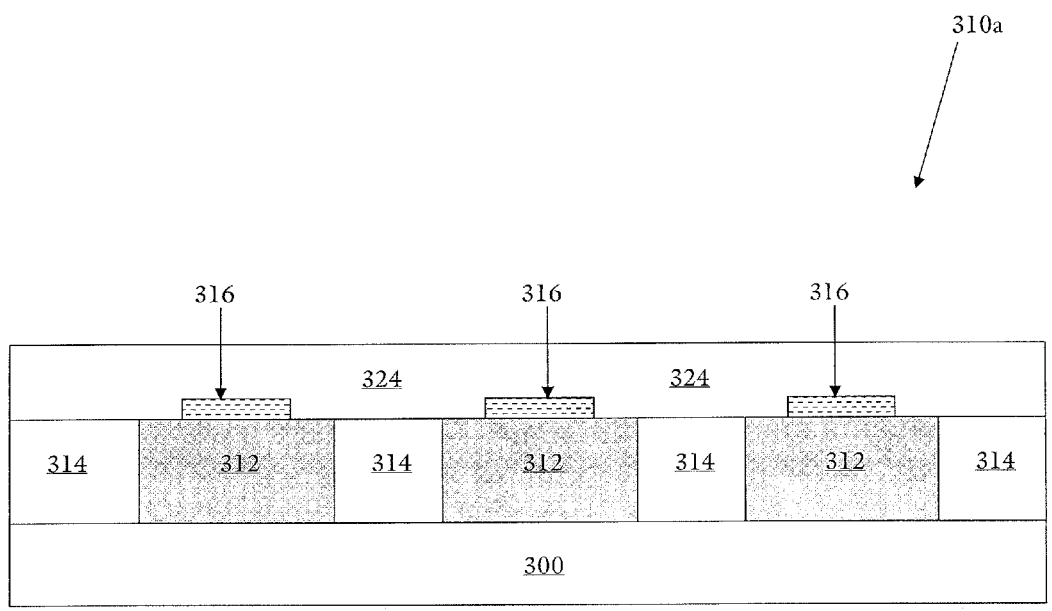

In an alternative embodiment, the steps shown in FIGS. 3B-3D are performed. Subsequently, as shown in FIG. 4A, a GCIB deposited heater material 316 is blanket deposited over the electrodes 312 and the first insulating layers 314. Then, a portion of the heater material 316 is removed using methods known in the art, such as photolithographic and etching techniques, to expose the insulating layers 314 (FIG. 4B). Referring to FIG. 4C, the second insulating layer 324 is then blanket deposited over the heater materials 316 and the first insulating layers 314. Then, a portion of the second insulating layer 324 is removed using methods known in the art, such as photolithographic and etching techniques, to expose the heater material 316 as shown in FIG. 3H. Subsequently, the method follows the process as outlined with respect to FIG. 3I to achieve the resulting structure shown in FIG. 3A.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings, but is only limited by the scope of the appended claims.

I claim:

1. A memory cell, comprising:
a first electrode;
an insulating material on the first electrode;
a via in the insulating material exposing a surface of the first electrode;
a gas cluster ion beam formed heater material within the via, wherein the heater material has Ge as a primary atom and includes nitrogen impurity atoms that have a gradient nitrogen level through a thickness of the material;
a variable resistance material within the via; and
a second electrode on the variable resistance material and heater material.

2. The memory cell of claim 1, wherein the heater material is formed on the surface of the first electrode and the variable resistance material is formed on the heater material.

3. The memory cell of claim 2, wherein a portion of the heater material on the insulating material is removed.

4. The memory cell of claim 1, wherein the variable resistance material is a phase-change material.

5. The memory cell of claim 4, wherein the phase-change material is one of $Ge_xTe_y$, GaSb, $Sb_xTe_y$, InSb, InSe, $In_xSb_yTe_z$, $Sn_xSb_yTe_z$, $Ga_xSe_yTe_z$, InSbGe, AgInSbTe, GeSnSbTe, $Te_xGe_ySb_zS_k$, and GeSbSeTe.

6. The memory cell of claim 5, wherein the phase-change material has at least one of O, F, N, or C as impurity atoms.

7. The memory cell of claim 1, wherein the variable resistance material is one of NiO, TiO, CuS, and SrTiO.

8. The memory cell of claim 1, wherein the impurity atoms are from about 0.5 to about 15 atomic percent of the heater material.

9. The memory cell of claim 1, wherein the impurity atoms are from about 5 to about 10 atomic percent of the heater material.

10. A memory cell, comprising:
a first electrode;
a gas cluster ion beam formed heater material on the first electrode, wherein the heater material has Ge as a primary atom and includes nitrogen impurity atoms that have a gradient nitrogen level through a thickness of the material;
an insulating material on the heater material;
a via in the insulating material to expose a surface of the heater material;
a variable resistance material within the via; and
a second electrode on the variable resistance material and the insulating material.

11. The memory cell of claim 10, wherein the variable resistance material is a phase-change material.

12. The memory cell of claim 11, wherein the phase-change material is one of $Ge_xTe_y$, GaSb, $Sb_xTe_y$, InSb, InSe, $In_xSb_yTe_z$, $Sn_xSb_yTe_z$, $Ga_xSe_yTe_z$, InSbGe, AgInSbTe, GeSnSbTe, $Te_xGe_ySb_zS_k$, and GeSbSeTe.

13. The memory cell of claim 12, wherein the phase-change material has at least one of O, F, N, or C as impurity atoms.

14. The memory cell of claim 10, wherein the variable resistance material is one of NiO, TiO, CuS, and SrTiO.

15. The memory cell of claim 10, wherein the impurity atoms are from about 0.5 to about 15 atomic percent of the heater material.

16. The memory cell of claim 10, wherein the impurity atoms are from about 5 to about 10 atomic percent of the heater material.

* * * * *